United States Patent
Huang et al.

(10) Patent No.: US 10,139,454 B2
(45) Date of Patent: Nov. 27, 2018

(54) TEST DEVICE AND ALTERNATING CURRENT POWER DETECTION METHOD OF THE SAME

(71) Applicant: Test Research, Inc., Taipei (TW)

(72) Inventors: Hsin-Wei Huang, Taipei (TW); Chien-Wei Chen, Taipei (TW)

(73) Assignee: Test Research, Inc., Taipei (TW)

( * ) Notice: Subject to any disclaimer, the term of this patent is extended or adjusted under 35 U.S.C. 154(b) by 139 days.

(21) Appl. No.: 15/227,976

(22) Filed: Aug. 4, 2016

(65) Prior Publication Data

US 2017/0205471 A1    Jul. 20, 2017

Related U.S. Application Data

(63) Continuation-in-part of application No. 15/002,371, filed on Jan. 20, 2016.

(51) Int. Cl.
| | |
|---|---|
| *G01R 31/42* | (2006.01) |
| *G01R 1/08* | (2006.01) |
| *G08B 21/18* | (2006.01) |
| *G01R 19/165* | (2006.01) |
| *G01R 31/44* | (2006.01) |

(52) U.S. Cl.
CPC .......... *G01R 31/42* (2013.01); *G01R 1/08* (2013.01); *G01R 19/16547* (2013.01); *G01R 31/44* (2013.01); *G08B 21/182* (2013.01)

(58) Field of Classification Search
CPC ....... G01R 19/165; G01R 21/00; G01R 35/00
See application file for complete search history.

(56) References Cited

U.S. PATENT DOCUMENTS

| | | | | |
|---|---|---|---|---|
| 6,031,370 A | * | 2/2000 | Kataoka | G01R 19/22 324/537 |
| 6,198,401 B1 | * | 3/2001 | Newton | H02H 1/0015 324/500 |
| 6,777,954 B2 | * | 8/2004 | Yamada | G01R 31/025 324/508 |
| 7,088,564 B1 | * | 8/2006 | Chaudhry | H01R 13/6683 361/42 |

(Continued)

FOREIGN PATENT DOCUMENTS

| | | |
|---|---|---|
| TW | I449922 B | 8/2014 |
| TW | 201510538 A | 3/2015 |
| TW | I482977 B | 5/2015 |

*Primary Examiner* — Jermele M Hollington
*Assistant Examiner* — Dominic E Hawkins
(74) *Attorney, Agent, or Firm* — CKC & Partners Co., Ltd.

(57) ABSTRACT

A test device is provided. The test device includes test components, power supplies, an alternating current (AC) power detection circuit and an alert module. The power supplies convert an AC power through a first wire, a second wire and an earth wire to a direct current (DC) power and supply the DC power to the test components. The AC power detection circuit receives the AC power through the first wire, the second wire and the earth wire to determine whether both of voltage differences between the first wire and the earth wire and between the second wire and the earth wire is outside of respective predetermined ranges. When both of the voltage differences are outside of the corresponding predetermined range, the AC power detection circuit controls the alert module to generate an alerting signal.

16 Claims, 3 Drawing Sheets

(56) References Cited

U.S. PATENT DOCUMENTS

| | | | |
|---|---|---|---|
| 7,969,154 B2* | 6/2011 | Lenzie | H02H 3/16 |
| | | | 324/508 |
| 8,164,866 B2* | 4/2012 | Vedula | H02H 7/26 |
| | | | 361/18 |
| 8,929,044 B2 | 1/2015 | Vandergrift | |
| 2002/0027432 A1* | 3/2002 | Oohashi | H02H 7/097 |
| | | | 324/86 |
| 2003/0107855 A1* | 6/2003 | Hsu | H02H 3/08 |
| | | | 361/42 |
| 2013/0134910 A1* | 5/2013 | Iwashita | H02P 3/14 |
| | | | 318/376 |
| 2014/0214343 A1* | 7/2014 | Bengtsson | H02H 7/1255 |
| | | | 702/58 |
| 2015/0177283 A1 | 6/2015 | Jung | |
| 2015/0188306 A1* | 7/2015 | Yalla | H02H 3/382 |
| | | | 361/15 |
| 2017/0142792 A1* | 5/2017 | Roberts | H02J 7/0068 |

* cited by examiner

TEST DEVICE AND ALTERNATING CURRENT POWER DETECTION METHOD OF THE SAME

RELATED APPLICATIONS

This application is a Continuation-in-part of U.S. application Ser. No. 15/002,371, filed on Jan. 20, 2016, and the entirety of which is incorporated by reference herein.

BACKGROUND

Field of Invention

The present invention relates to a test technology. More particularly, the present invention relates to a test device and an alternating current power detection method of the same.

Description of Related Art

Test devices such as, but not limited to automatic test equipments (ATEs) are devices used in testing electronic circuits, often referred to as "devices under test" (DUTs). The test equipment typically includes signal circuitry for generating selected excitation signals applied to the DUT test points for detecting or monitoring response signals therefrom as part of a manufacturer's quality assurance testing program or as a diagnostic procedure during circuit board repair and servicing.

Normally, the test devices receive alternating current (AC) power transmitted through three power lines and operate accordingly, in which one of the power lines is an earth line. When the earth line is not appropriately grounded, the received AC power may not be stable. Under such a condition, not only the test components in the test devices may be damaged, but also the leakage current may cause fire or explosion. As a result, a detection mechanism is unavoidable to protect the test devices.

Accordingly, what is needed is a test device and an alternating current power detection method of the same to address the above issues.

SUMMARY

The invention provides a test device. The test device includes a plurality of test components, a plurality of power supplies, an alternating current (AC) power detection circuit and an alert module. The power supplies are electrically coupled in parallel each to receive an AC power through a first wire, a second wire and an earth wire to convert the AC power to a direct current (DC) power and supply the DC power to the test components. The AC power detection circuit is electrically coupled to the power supplies in parallel to receive the AC power through the first wire, the second wire and the earth wire, wherein the AC power detection circuit determines whether a first voltage difference between the first wire and the earth wire is outside of a first predetermined range and determines whether a second voltage difference between the second wire and the earth wire is outside of a second predetermined range. When the first voltage difference is outside of the first predetermined range and the second voltage difference is outside of the second predetermined range, the AC power detection circuit controls the alert module to generate an alerting signal.

Another aspect of the present invention is to provide an AC power detection method used in a test device. The AC power detection method includes the steps outlined below. A plurality of power supplies are electrically coupled in parallel each to receive an AC power through a first wire, a second wire and an earth wire to convert the AC power to a DC power and supply the DC power to a plurality of test components in the test device. An AC power detection circuit is electrically coupled to the power supplies in parallel to receive the AC power through the first wire, the second wire and the earth wire. Whether a first voltage difference between the first wire and the earth wire is outside of a first predetermined range and whether a second voltage difference between the second wire and the earth wire is outside of a second predetermined range are determined by the AC power detection circuit. When the first voltage difference is outside of the first predetermined range and the second voltage difference is outside of the second predetermined range, an alert module is controlled to generate an alerting signal by the AC power detection circuit.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
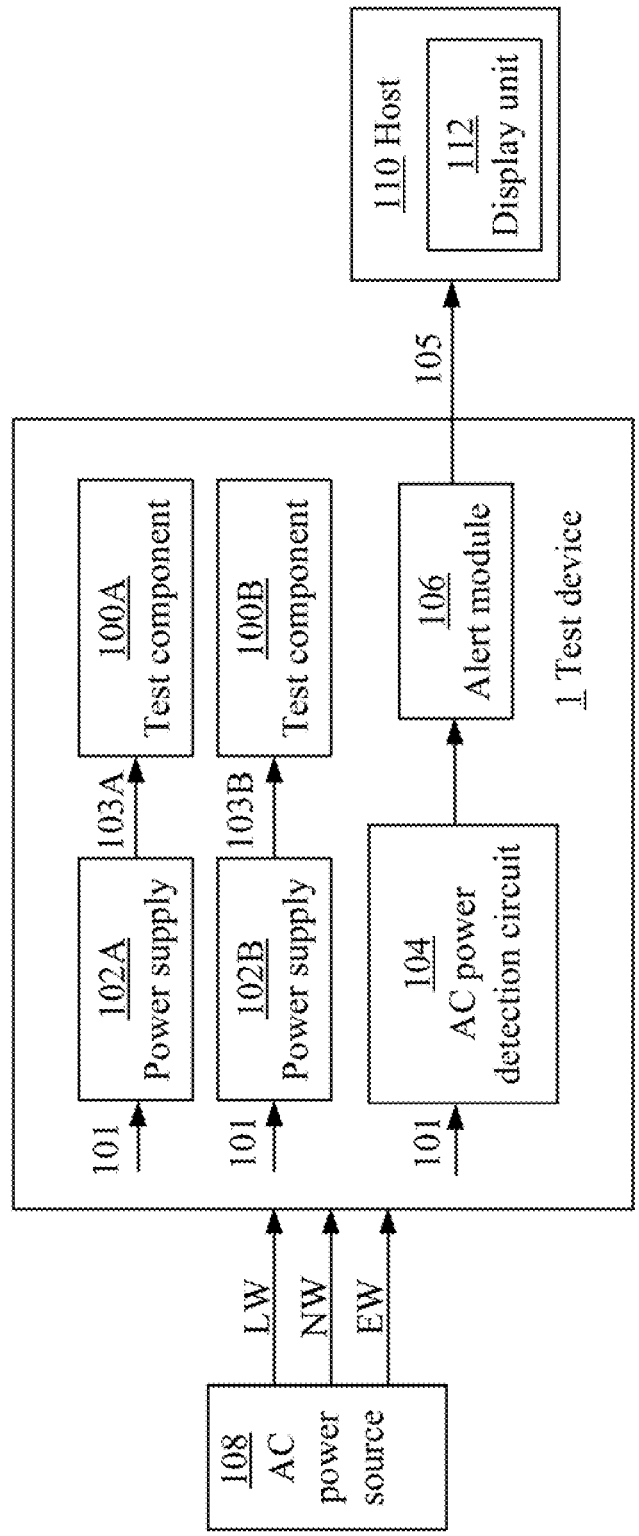
FIG. 1 is a block diagram of a test device in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Reference is now made to FIG. 1. FIG. 1 is a block diagram of a test device 1 in an embodiment of the present invention. The test device 1 includes test components 100A-100B, power supplies 102A-102B, an alternating current (AC) power detection circuit 104 and an alert module 106.

In an embodiment, the test device 1 is such as, but not limited to an automatic test equipment (ATE) used in testing electronic circuits, often referred to as "devices under test" (DUTs).

The power supplies 102A-102B are electrically coupled in parallel each to receive an AC power 101 to convert the AC power 101 to direct current (DC) powers 103A and 103B respectively. Moreover, the power supplies 102A-102B supply the DC powers 103A and 103B to the test components 100A-100B respectively.

The test components 100A-100B can be any circuits used for performing test on the DUTs such as, but not limited to a voltmeter, an ohmmeter or an ammeter used for basic measurement of voltages, currents and resistances in the DUTs, a signal generator, a digital pattern generator or a pulse generator for stimulus of the DUTs or a oscilloscope or a frequency counter for analyzing the response of the DUTs.

It is appreciated that the number of the test components 100A-100B and number of the power supplies 102A-102B can be different depending on various applications and is not limited thereto. Further, one power supply can provide the DC power to one or more than one test components.

The AC power detection circuit 104 is electrically coupled to the power supplies 102A-102B in parallel to receive the AC power 101. More specifically, the power supplies 102A-102B and the AC power detection circuit 104 receive the AC power 101 through a live wire LW, a neutral wire NW and an earth wire EW in FIG. 1 from an AC power source 108.

In an embodiment, the live wire LW is electrically coupled directly to the generators of the electricity supply company and carries the voltage such as but not limited to 110 volts or 220 volts, depending on different types of generators. The neutral wire NW returns the electricity to the generator after it has passed through loads such as the test components or various appliances. The earth wire EW usually carries no electricity and is grounded. In general, both of the neutral wire NW and the earth wire EW at approximately zero volts.

The AC power detection circuit 104 determines whether a voltage difference between the live wire LW and the earth wire EW is outside of a predetermined range. For example, since the earth wire EW is approximately zero volts, when the live wire LW carries 110 volts, the AC power detection circuit 104 determines whether the voltage difference between the live wire LW and the earth wire EW is larger than or smaller than a predetermined range around 110 volts, such as but not limited to 90 volts to 120 volts. When the voltage difference between the live wire LW and the earth wire EW is outside of such a predetermined range, the AC power detection circuit 104 determines that the earth wire EW is not appropriately grounded.

The AC power detection circuit 104 can also determine whether a voltage difference between the neutral wire NW and the earth wire EW is outside of a predetermined range. For example, since the earth wire EW and the neutral wire NW are both approximately zero volts, the AC power detection circuit 104 determines whether the voltage difference between the neutral wire NW and the earth wire EW is larger than or smaller than a predetermined range around 0 volts, such as but not limited to 2 volts to −2 volts. When the voltage difference between the neutral wire NW and the earth wire EW is outside of such a predetermined range, the AC power detection circuit 104 determines that the earth wire EW is not appropriately grounded.

When the earth wire EW is not appropriately grounded, the AC power 101 mentioned above may not be stable and may result in inappropriate voltage level of the DC powers 103A and 103B. Under such a condition, not only the test components 100A-100B in the test devices 1 may be damaged, but also the leakage current may cause fire or explosion.

As a result, when the voltage difference between the live wire LW and the earth wire EW is outside of the predetermined range (e.g. the range of 90 volts to 120 volts mentioned above) and the voltage difference between the neutral wire NW and the earth wire EW is outside of the predetermined range (e.g. the range of 2 volts to −2 volts mentioned above), the AC power detection circuit 104 controls the alert module 106 to generate an alerting signal 105.

In an embodiment, the alert module 106 is a light-emitting module, and the alerting, signal 105 is a light signal with various kinds of colors or a flashing light signal flashing with various kinds of frequencies. In another embodiment, the alert module 106 is a sound-generating module, and the alerting signal 105 is a sound signal.

In yet another embodiment, the alert module 106 is a signal generator, and the alerting signal 105 is an electric signal. The alert module 106 is electrically coupled to a host 110 such that the host 110 receives the alerting signal 105. In an embodiment, the alerting signal 105 is an analog signal that needs to be converted into a digital signal to be received by the host 110. In another embodiment, the alerting signal 105 is a digital signal.

Once the host 110 receives the alerting signal 105, the host 110 can initiate a protection procedure to protect the test components 100A-100B. In an embodiment, the host 110 may further include a display unit 112 such that the host 110 displays an intimating frame (not illustrated) on the display unit 112 to intimate the user.

Figure 2:
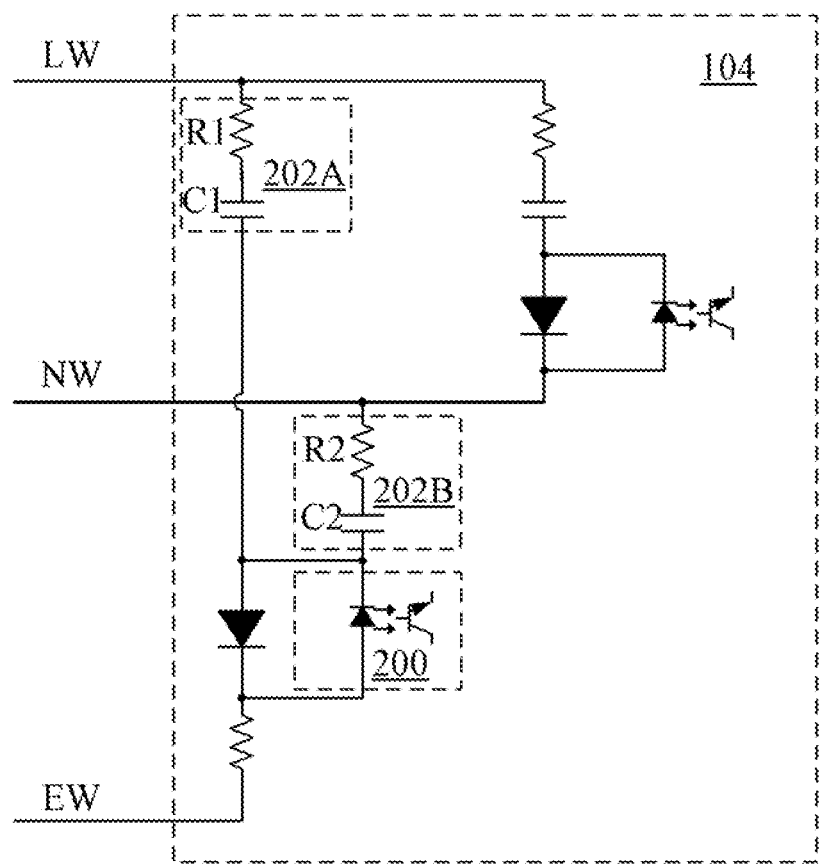
FIG. 2 is a circuit diagram of the AC power detection circuit electrically coupled to live wire, the neutral wire and the earth wire in an embodiment of the present invention.

Reference is now made to FIG. 2. FIG. 2 is a circuit diagram of the AC power detection circuit 104 electrically coupled to live wire LW, the neutral wire NW and the earth wire EW in an embodiment of the present invention.

The AC power detection circuit 104 includes a photo coupler 200 electrically coupled between the live wire LW and the earth wire EW. In different embodiments, the photo coupler 200 can be such as, but not limited to a resistive photo coupler, a diode photo coupler, a transistor photo coupler, a silicon-controlled rectifier (SCR) photo coupler, a TRIAC photo coupler or a solid-state relay type of photo coupler.

The photo coupler 200 is conducted during either a negative cycle or a positive cycle of the AC power 101. When the photo coupler 200 is conducted a voltage between the two ends of the photo coupler 200 can be measured. According to such a voltage, whether the voltage difference between the live wire LW and the earth wire EW is outside of the predetermined range can be determined.

Moreover, the AC power detection circuit 104 includes a resistor-capacitor circuit 202A that includes a resistor R1 and a capacitor C1 electrically coupled in series with the photo coupler 200.

It is noted that in some conditions, the live wire LW and the neutral wire NW may be disposed in a reverse way. In order to perform measurement under such a condition, an additional resistor-capacitor circuit 202B that includes a resistor R2 and a capacitor C2 is disposed.

In some approaches, the circuits used to detect whether the earth wire EW is appropriately grounded is easily affected by the capacitors in the load, e.g. the power supplies, coupled thereto. By electrically coupling the resistor-capacitor circuit 202 to the photo coupler 200, the effect of the capacitors can be reduced.

Figure 3:
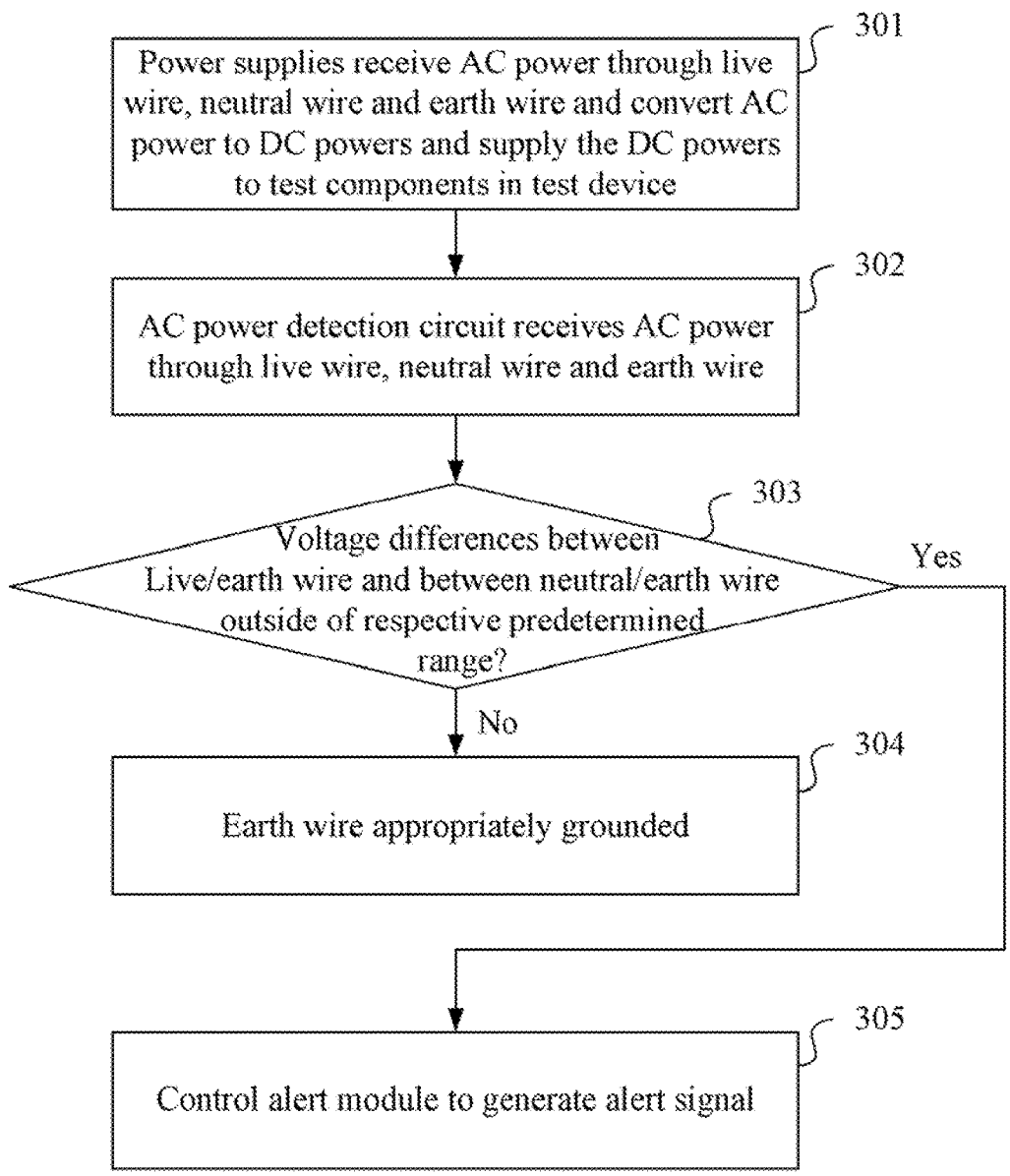
FIG. 3 is a flow chart of an AC power detection method in an embodiment of the present invention.

Reference is now made to FIG. 3. FIG. 3 is a flow chart of an AC power detection method 300 in an embodiment of the present invention. The AC power detection method 300 can be used in the test device 1 illustrated in FIG. 1. The AC power detection method 300 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 301, the power supplies 102A-102B are electrically coupled in parallel each to receive the AC power 101 through the live wire LW, the neutral wire NW and the earth wire EW to convert the AC power 101 to the DC powers 103A and 103B and supply the DC powers 103A and 103B to the test components 100A-100B in the test device 1.

In step 302, the AC power detection circuit 104 is electrically coupled to the power supplies 102A-102B in parallel to receive the AC power 101 through the live wire LW, the neutral wire NW and the earth wire EW.

In step 303, the AC power detection circuit 104 determines whether both of the voltage differences between the lure wire and the earth wire and between the neutral wire NW and the earth wire EW is outside of the respective predetermined range.

When at least one of the voltage differences between the live wire and the earth wire and between the neutral wire NW and the earth wire EW is not outside of the respective predetermined range, the AC power detection circuit 104 determines that the earth wire is appropriately grounded in step 304.

When both of the voltage differences between the live wire and the earth wire and between the neutral wire NW and the earth wire EW is outside of the respective predetermined range, in step 305, the AC power detection circuit 104 determines that the earth wire is not appropriately grounded and controls the alert module 106 to generate the alerting signal 105.

Although the present invention has been described in considerable detail with reference to certain embodiments thereof, other embodiments are possible. Therefore the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test device comprising:
   a plurality of test components;
   a plurality of power supplies electrically coupled in parallel each to receive an alternating current (AC) power through a first wire, a second wire and an earth wire to convert the AC power to a direct current (DC) power and supply the DC power to the test components;
   an AC power detection circuit electrically coupled to the power supplies in parallel to receive the AC power through the first wire, the second wire and the earth wire, wherein the AC power detection circuit determines whether a first voltage difference between the first wire and the earth wire is outside of a first predetermined range and determines whether a second voltage difference between the second wire and the earth wire is outside of a second predetermined range; and
   an alert module;
   wherein when the first voltage difference is outside of the first predetermined range and the second voltage difference is outside of the second predetermined range, the AC power detection circuit controls the alert module to generate an alerting signal.

2. The test device of claim 1, wherein one of the first wire and the second wire is a live wire and the other is a neutral wire.

3. The test device of claim 1, wherein the alert module is a light-emitting module, and the alerting signal is a light signal or a flashing light signal.

4. The test device of claim 1, wherein the alert module is a sound-generating module, and the alerting signal is a sound signal.

5. The test device of claim 1, wherein the alert module is electrically coupled to a host such that the host receives the alerting signal to initiate a protection procedure to protect the test components.

6. The test device of claim 1, wherein the alert module is electrically coupled to a host comprising a display unit such that the host receives the alerting signal to display an intimating frame on the display unit.

7. The test device of claim 2, wherein the AC power detection circuit comprises a photo coupler electrically coupled between the live wire and the earth wire to be conducted during either a negative cycle or a positive cycle of the AC power to determine whether the voltage difference between the live wire and the earth wire is outside of the predetermined range.

8. The test device of claim 7, wherein the AC power detection circuit further comprises a resistor-capacitor circuit electrically coupled in series with the photo coupler.

9. An AC power detection method used in a test device comprising:
   electrically coupling a plurality of power supplies in parallel each to receive an AC power through a first wire, a second wire and an earth wire to convert the AC power to a DC power and supply the DC power to a plurality of test components in the test device;
   electrically coupling an AC power detection circuit to the power supplies in parallel to receive the AC power through the first wire, the second wire and the earth wire;
   determining whether a first voltage difference between the first wire and the earth wire is outside of a first predetermined range and determines whether a second voltage difference between the second wire and the earth wire is outside of a second predetermined range by the AC power detection circuit; and
   when the first voltage difference is outside of the first predetermined range and the second voltage difference is outside of the second predetermined range, controlling an alert module to generate an alerting signal by the AC power detection circuit.

10. The AC power detection method of claim 9, wherein one of the first wire and the second wire is a live wire and the other is a neutral wire.

11. The AC power detection method of claim 9, wherein the alert module is a light-emitting module, and the alerting signal is a light signal or a flashing light signal.

12. The AC power detection method of claim 9, wherein the alert module is a sound-generating module, and the alerting signal is a sound signal.

13. The AC power detection method of claim 9, wherein the alert module is electrically coupled to a host, and the AC power detection method further comprises:
   receiving the alerting signal by the host; and
   initiating a protection procedure to protect the test components.

14. The AC power detection method of claim 9, wherein the alert module is electrically coupled to a host comprising a display unit, and the AC power detection method further comprises:
   receiving the alerting signal by the host; and
   displaying an intimating frame on the display unit.

15. The AC power detection method of claim 10, wherein the AC power detection circuit comprises a photo coupler electrically coupled between the live wire and the earth wire, and the AC power detection method further comprises:
   conducting the photo coupler during either a negative cycle or a positive cycle of the AC power; and
   determining whether the voltage difference between the live wire and the earth wire is outside of the predetermined range.

16. The AC power detection method of claim 15, further comprising:
   electrically coupling a resistor-capacitor circuit in series with the photo coupler.

\* \* \* \* \*